United States Patent [19]
Scifres et al.

[11] 3,983,509
[45] Sept. 28, 1976

[54] DISTRIBUTED FEEDBACK DIODE LASER

[75] Inventors: Donald R. Scifres; Robert D. Burnham, both of Los Altos, Calif.

[73] Assignee: Xerox Corporation, Stamford, Conn.

[22] Filed: Apr. 25, 1975

[21] Appl. No.: 572,475

[52] U.S. Cl. .............................. 331/94.5 H; 357/18
[51] Int. Cl.² ........................................... H01S 3/19
[58] Field of Search ................. 331/94.5 H; 357/17, 357/18

[56] References Cited
UNITED STATES PATENTS
3,737,737   6/1973   Heywang et al. .......... 331/94.5 H X OTHER PUBLICATIONS
"Quantum States of Confined Carriers, Etc.", R. Dingle et al., Physical Review Letters, vol. 33, No. 14, Sept. 3, 1974, pp. 827–830.

*Primary Examiner*—Eugene La Roche
*Attorney, Agent, or Firm*—J. E. Beck; T. J. Anderson; L. Zalman

[57] ABSTRACT

A laser having layers of a first material interleaved with layers of a second material with the first material having a different index of refraction and bandgap than those of the second material. The thicknesses of the layers of the first and second materials satisfy the relationship $t = m \lambda/2n$ where $m$ is the laser mode and $n$ is the index of refraction of the material, such that the right and left going waves of the light produced by the layers of the first material when the laser is pumped are coupled and reinforced in a coherent manner by the layers of the second material such that reflections from the second material are in phase, thus allowing laser operation in the absence of discrete end mirrors.

6 Claims, 4 Drawing Figures

DISTRIBUTED FEEDBACK DIODE LASER

BACKGROUND OF THE INVENTION

In copending U.S. patent application Ser. No. 499,671, filed Aug. 22, 1974, there is disclosed an electrically pumped, heterojunction, distributed feedback, solid state diode laser which utilizes a grating or periodic structure situated at a heterojunction interface. The periodic structure interacts with the light produced by the active laser medium to provide the feedback necessary for lasing. The periodic structure is produced by an interferometric exposure technique which utilizes a beam splitter and two mirrors to direct two laser light beams of equal intensity and equal polarization upon a photoresist with equal angles of incidence. As is apparent, a periodic structure with a period on the order of 3600 A is often difficult to produce.

OBJECTS OF THE INVENTION

It is an object of the present invention to provide an improved heterojunction diode laser.

It is a further object of the present invention to provide an improved heterojunction diode laser that can be electrically pumped.

SUMMARY OF THE INVENTION

In accordance with the invention, distributed feedback in an electrically pumped, solid state heterojunction diode laser is provided by multiple layers of material having different indices of refraction and different bandgaps. These two properties are provided by GaAs and GaAlAs and the laser can be comprised of layers of GaAs interleaved with layers of GaAlAs. A PN junction is formed perpendicular to the planes of the interleaved layers and when the laser is pumped, the interleaved layers will provide feedback if the thicknesses of the layers is related to the laser wavelength $\lambda$ according to the relationship $t = m\lambda/2n$ where $m$ is an integer relating to the laser mode and $n$ is the refractive index of the material of a particular layer.

DESCRIPTION OF THE PREFERRED EMBODIMENT

Figure 1:
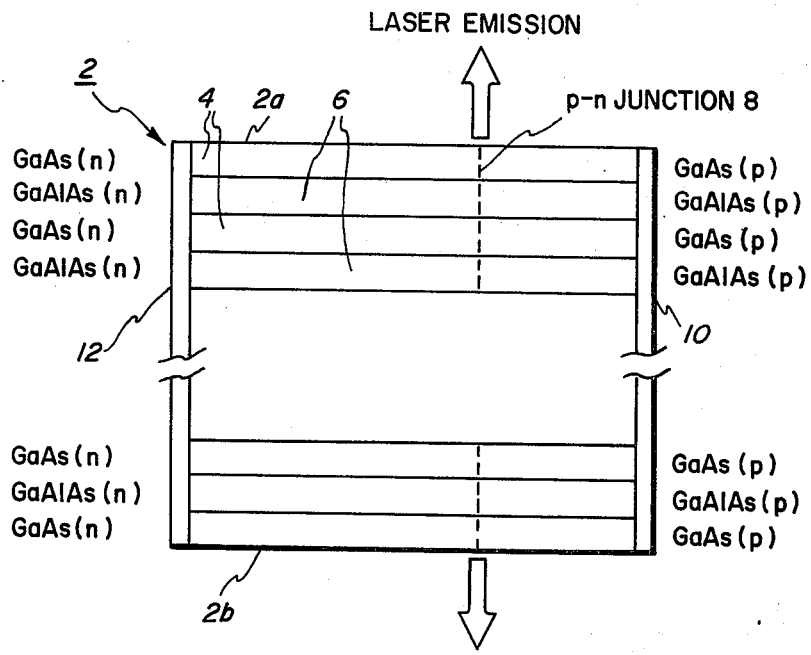
FIG. 1 is an end view of a laser in accordance with the invention.

Referring to FIG. 1, there is shown an electrically pumped, solid state, distributed feedback, heterojunction diode laser 2 in accordance with the invention. Laser 2 is comprised of layers 4 of GaAs interleaved with layers 6 of GaAlAs. The layers 4 and 6 are doped to provide a PN junction 8 perpendicular to the planes of the layers 4 and 6.

For the device of FIG. 1 to exhibit distributed feedback laser operation, alternate regions of gain and refractive index must be provided perpendicular to the plane of the PN junction 8. The GaAs layers 4 and the GaAlAs layers 6 provide these two dissimilar properties. First, GaAs at a doping level of $10^{17}/cm^3$ has an index of refraction of approximately 3.6 which is higher than the approximately 3.4 index of refraction of $Ga_{0.7}Al_{0.3}As$ at the same doping level. The magnitude of the difference varies as the concentration of aluminum in the GaAlAs layers 6 varies with concentrations of aluminum between 0.04 and 0.9 producing satisfactory results. Second, GaAs has a bandgap of 1.41 ev which is substantially lower than the 1.8 ev bandgap of GaAlAs.

When the laser of FIG. 1 is electrically pumped, such as by applying 0.5 microsecond pulses of approximately 7 amps and 15 volts, with a pulse delivered every $10^{-3}$ seconds, to electrode 10 when electrode 12 is grounded, the GaAs layers 4 will conduct current and will emit light. The GaAlAs layer 6 will not emit light due to the higher bandgap of these layers. The light produced by layers 4 will traverse the entire region between the top surface 2a and the bottom surface 2b of the laser 2 since the GaAlAs layers 6 will not absorb at the wavelength emitted by the GaAs layers 4. To provide a lasing action, there must be constructive feedback of the light emitted by layers 4. Feedback is achieved by having each of the GaAs layers 4 satisfy the thickness relationships $$t_{GaAs} = m \ \lambda/2n_{GaAs} \qquad (1)$$

and each of the GaAlAs layer 6 satisfy the thickness relationship $$t_{GaAlAs} = m \ \lambda/2n_{GaAlAs} \qquad (2)$$

whereby $\lambda$ is the wavelength of the light emitted by the GaAs layers 4, $m$ is a small integer corresponding to the Bragg order, and $n_{GaAs}$ and $n_{GaAlAs}$ are the refractive indices of layers 4 and 6, respectively. With these thicknesses, the upward and downward going waves of the light emitted by GaAs layers 4 will be coupled and reinforced in a coherent manner by the GaAlAs layers 6 such that reflections are in phase, thus allowing laser operation in the absence of end mirrors. If $m$ equals 1 and the wavelength of the light emitted by the GaAs layers 4 is 8500 A, the layers 4 would have a thickness of about 1180 A and layer 6 would have a thickness of about 1250 A. For sufficient feedback to provide lasing, it is believed that the total number of layers of different material should be on the order of 20 or more.

The device of FIG. 1 is produced by growing successive layers of $n$-type GaAs and $n$-type GaAlAs to the thicknesses dictated by equations (1) and (2). This could be achieved by conventional liquid phase epitaxial growth practices wherein the laser body is shuttled back and forth between $n$-type doped melts of GaAs and GaAlAs. Following formation or growth of the multiple $n$-type layers of GaAs and GaAlAs, PN junction 8 is formed by diffusion of $p$-type dopent material from the right edge of the multi-layered device. Contacts 10 and 12 are then applied to the right and left edges of the multi-layered device 2.

Figure 2:
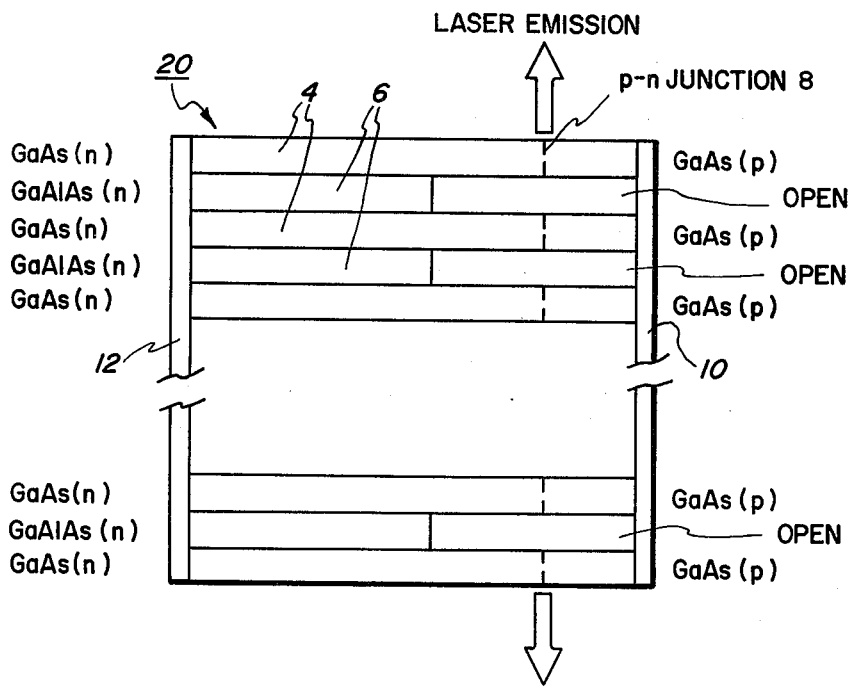
FIG. 2 is an end view of another embodiment of the laser of the present invention.

FIG. 2 shows a further embodiment of a multi-layered laser 20 in accordance with the invention. The laser of FIG. 2 has the same layer thicknesses and pumping conditions as the laser in FIG. 1. After formation of the PN junction 8, the GaAlAs layers 6 may be etched away to beyond the PN junction 8 by a preferential etching solution which chemically reacts with the GaAlAs layers 6 but not with the GaAs layers 4. Nitric acid is a suitable preferential etching solution. With the GaAlAs layers 6 etched away to beyond the PN junction 8, no current can flow through the PN junction 8 from one layer to the next. Also, the index of refraction of the material adjacent the GaAs layers 4 is greatly increased. These factors increase the amount of constructive feedback obtainable per layer and will allow lower threshold pump current densities.

Figure 3:
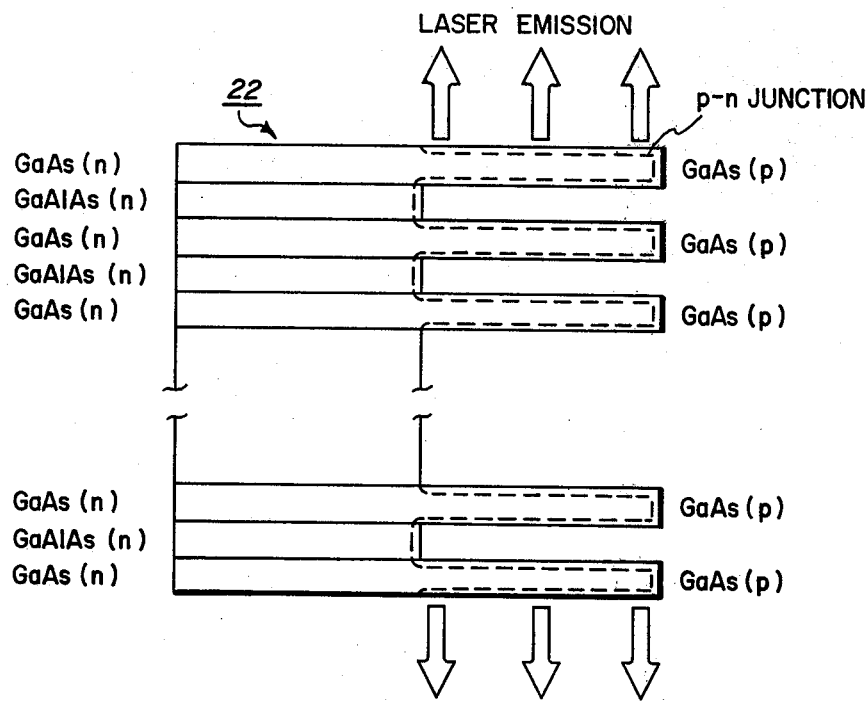
FIG. 3 is an end view of still another embodiment of the laser of the present invention.

FIG. 3 shows a multi-layered laser 22 in accordance with the invention in which the light emission is obtained over a wide area of the laser. In this laser, the layer thicknesses and compositions are the same as that of the laser of FIG. 2 with the difference being that the PN junction is formed after portions of the GaAlAs layers are preferentially etched away. Since light is now emitted from the GaAs layers over a large area of these layers, laser operation is obtainable over a large area of the laser device 22.

Figure 4:
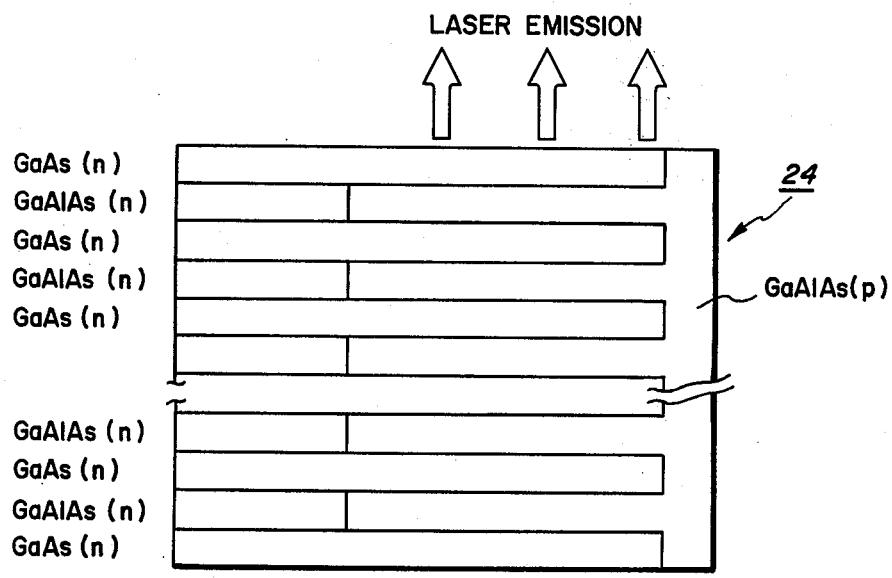
FIG. 4 is an end view of a further embodiment of the laser of the present invention.

A further configuration for providing light emission over a wide area of the laser is shown in FIG. 4. After portions of the $n$-type GaAlAs are preferentially etched away (as in the construction of the laser of FIG. 3) a $p$-type layer of GaAlAs is grown in the etched cavities by liquid phase epitaxy to provide the laser 24 of FIG. 4. The laser 24 is physically stronger than the laser 22 of FIG. 3 and has a double heterojunction configuration. Due to current confinement by the heterojunction layers, lower thresholds may be possible. Again, as is the case in the laser 22, laser operation can be obtained over a large device area leading to a high power, low divergence output beam.

The invention is not limited to the use of GaAs and GaAlAs layers. Other materials capable of being grown in small layers, such as, for example, GaP or GaAlP, can also be used.

What is claimed is:

1. An electrically pumped multi-layered, diode laser comprising:
    a first plurality of layers of a first semiconductor material,
    a second plurality of layers of a second semiconductor material,
    said first and second semiconductor materials having different indices of refraction and different bandgaps, said second plurality of layers being interleaved with said first plurality of layers such that alternate layers of said laser are of different semiconductor material,
    each of said plurality of interleaved layers having a thickness $t$ according to the relationship $t = m\lambda/2n$ where $m$ is an integer equal to the mode of the laser oscillations, $\lambda$ is the wavelength of the light photons generated in the first plurality of layers when they are electrically pumped, and $n$ is the refractive index of the material of said each layer,
    a rectifying junction extending through at least said first plurality of layers, and
    means for electrically pumping said first plurality of layers to produce said light photons of said wavelength whereby said light photons are coupled and reinforced in phase by said second plurality of layers to thereby provide a coherent output beam.

2. The laser of claim 1 wherein said first semiconductor material is gallium arsenide and said second semiconductor material is gallium aluminum arsenide.

3. The laser of claim 1 wherein said first plurality of layers extend beyond said second plurality of layers and said rectifying junction extends through only said first plurality of layers.

4. The laser of claim 1 wherein said first plurality of layers extend beyond said second plurality of layers and said rectifying junction extends through both said first and second plurality of layers near an edge of said first and second plurality of layers.

5. The laser of claim 1 wherein said rectifying junction extends through said first plurality of layers at an angle to the longitudinal surface planes of said first plurality of layers.

6. An electrically pumped, multi-layered diode laser comprising:
    a first plurality of layers of a first semiconductor material having an index of refraction $n_1$,
    a second plurality of layers of a second semiconductor material having an index of refraction $n_2$,
    said second plurality of layers being interleaved with said first plurality of layers such that alternate layers of said laser are of different semiconductor material,
    each of said first plurality of layers having a thickness $t$ according to the relationship $t = m\lambda/2n_1$ and each of said second plurality of layers having a thickness $t$ according to the relationship $t = m\lambda/2n_2$ where $m$ is an integer equal to the mode of the laser oscillations and $\lambda$ is the wavelength of the light photons generated in said first plurality of layers when they are electrically pumped,
    a rectifying junction extending through said first and second plurality of layers in a plane perpendicular to the longitudinal surfaces of said first and second plurality of layers, and
    means adjacent the plane of said rectifying junction for electrically pumping said multi-layered laser with voltage pulses having an amplitude and frequency such that only said first plurality of layers emit light photons with said light photons being of a wavelength that are reflected in phase by said second plurality of layers such that a coherent output light beam is omitted by the laser.

* * * * *